(12) United States Patent
Nomiyama et al.

(10) Patent No.: US 10,622,910 B2
(45) Date of Patent: Apr. 14, 2020

(54) SEMICONDUCTOR DEVICE AND METHOD OF OPERATING THE SAME

(71) Applicant: SAMSUNG ELECTRONICS CO., LTD., Suwon-si, Gyeonggi-Do (KR)

(72) Inventors: Takahiro Nomiyama, Seoul (KR); Sung Woo Moon, Seongnam-si (KR); Yus Ko, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 116 days.

(21) Appl. No.: 15/802,591

(22) Filed: Nov. 3, 2017

(65) Prior Publication Data

US 2018/0205324 A1 Jul. 19, 2018

(30) Foreign Application Priority Data

Jan. 16, 2017 (KR) .................. 10-2017-0007143

(51) Int. Cl.
| | |
|---|---|
| *H02M 7/217* | (2006.01) |
| *H02M 1/08* | (2006.01) |
| *H03K 17/16* | (2006.01) |
| *H02M 7/219* | (2006.01) |
| *H02M 1/00* | (2006.01) |
| *H03K 17/30* | (2006.01) |

(52) U.S. Cl.
CPC .......... *H02M 7/217* (2013.01); *H02M 1/083* (2013.01); *H02M 7/219* (2013.01); *H03K 17/164* (2013.01); *H02M 2001/0058* (2013.01); *H03K 2017/307* (2013.01); *H03K 2217/0045* (2013.01)

(58) Field of Classification Search
CPC ......... H02M 7/217; H02M 7/219; H02M 7/00
USPC .............................. 363/88, 89, 125, 126, 127
See application file for complete search history.

(56) References Cited

U.S. PATENT DOCUMENTS

| | | | |
|---|---|---|---|
| 7,015,561 | B2 | 3/2006 | Saxelby et al. |
| 7,843,257 | B2 | 11/2010 | Jones et al. |
| 7,880,454 | B2 | 2/2011 | Latham, II et al. |
| 9,075,696 | B2 | 7/2015 | Smith et al. |
| 9,257,914 | B2 | 2/2016 | Fattal |
| 2015/0146466 | A1 | 5/2015 | Kim et al. |
| 2015/0263534 | A1 | 9/2015 | Lee et al. |
| 2016/0079790 | A1 | 3/2016 | Kleinpenning et al. |
| 2016/0373109 | A1* | 12/2016 | Hwang ................. H02M 7/219 |

* cited by examiner

*Primary Examiner* — Nguyen Tran
(74) *Attorney, Agent, or Firm* — F. Chau & Associates, LLC

(57) ABSTRACT

Provided are a semiconductor device and a method of operating the same. A semiconductor device may include a comparator which compares a first voltage with a rectified voltage and provides a second voltage in accordance with the comparison. A timer circuit may operate a timer according to the second voltage and output a third voltage in correspondence with an operation time of the timer. A driver may drive a transistor with a fourth voltage generated by the driver according to the third voltage. A calibration circuit may generate a timer calibration signal based on the second voltage and the fourth voltage. The timer calibration signal may be provided to the timer circuit and used to calibrate the operation time of the timer. More efficient rectification, with reduced occurrence of reverse current, may thereby be realized.

17 Claims, 13 Drawing Sheets

SEMICONDUCTOR DEVICE AND METHOD OF OPERATING THE SAME

This application claims the benefit of Korean Patent Application No. 10-2017-0007143, filed on Jan. 16, 2017, in the Korean Intellectual Property Office, the disclosure of which is incorporated herein by reference in its entirety.

BACKGROUND

1. Field

The present disclosure relates to a semiconductor device and a method of operating the same, and more particularly, to a semiconductor device which performs rectification for converting an alternating current (AC) voltage into a direct current (DC) voltage and a method of operating the semiconductor device.

2. Discussion of the Related Art

A rectifier is used to convert an AC voltage into a DC voltage. In particular, with recently developed wireless power transmission techniques for consumer electronics, in an environment using an AC signal having relatively high frequency of, e.g., 6.78 MHz (a standard wireless charging frequency today), the operation of a rectifier affects the efficiency and stability of a wireless power apparatus using the rectifier.

Accordingly, it is desirable to efficiently and stably convert an AC voltage into a DC voltage in a high-speed operating environment, particularly in devices that receive wireless power. It is also desirable to prevent the generation of a reverse current between a rectified voltage and the AC voltage.

SUMMARY

Aspects of the disclosure provide a semiconductor device capable of efficiently and stably performing voltage conversion in a high-speed operating environment.

Aspects of the disclosure also provide a method of operating a semiconductor device capable of efficiently and stably performing voltage conversion in a high-speed operating environment.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, there is provided a semiconductor device including a comparator which compares a first voltage with a rectified voltage and provides a second voltage in accordance with the comparison. A timer circuit may operate a timer according to the second voltage and output a third voltage in correspondence with an operation time of the timer. A driver may drive a transistor with a fourth voltage generated by the driver according to the third voltage. A calibration circuit may generate a timer calibration signal based on the second voltage and the fourth voltage. The timer calibration signal may be provided to the timer circuit and used to calibrate the operation time of the timer.

According to another aspect of the disclosure, there is provided a semiconductor device including a first comparator which compares a voltage level of a first node with a voltage level of a rectified voltage to control a voltage level of a second node; a timer circuit which operates a timer according to the voltage level of the second node and controls a voltage level of a third node; a driver which drives a transistor by controlling a voltage level of a fourth node according to the voltage level of the third node; and a protection circuit which monitors a current flowing between the rectified voltage and the first node and, when a reverse current is generated, generates a timer stop signal for stopping the operation of the timer and provides the timer stop signal to the timer circuit.

According to still another aspect of the disclosure, there is provided a method of operating a semiconductor device including comparing a voltage level of a first node with a voltage level of a rectified voltage; operating a timer of a timer circuit which uses a second node as an input by controlling a voltage level of the second node according to the comparison result; driving a transistor by controlling a voltage level of a fourth node, which corresponds to an output of a driver, using the driver which operates using a third node corresponding to an output of the timer circuit as an input; and providing a timer calibration signal for calibrating an operation time of the timer to the timer circuit by monitoring the voltage level of the second node and the voltage level of the fourth node.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
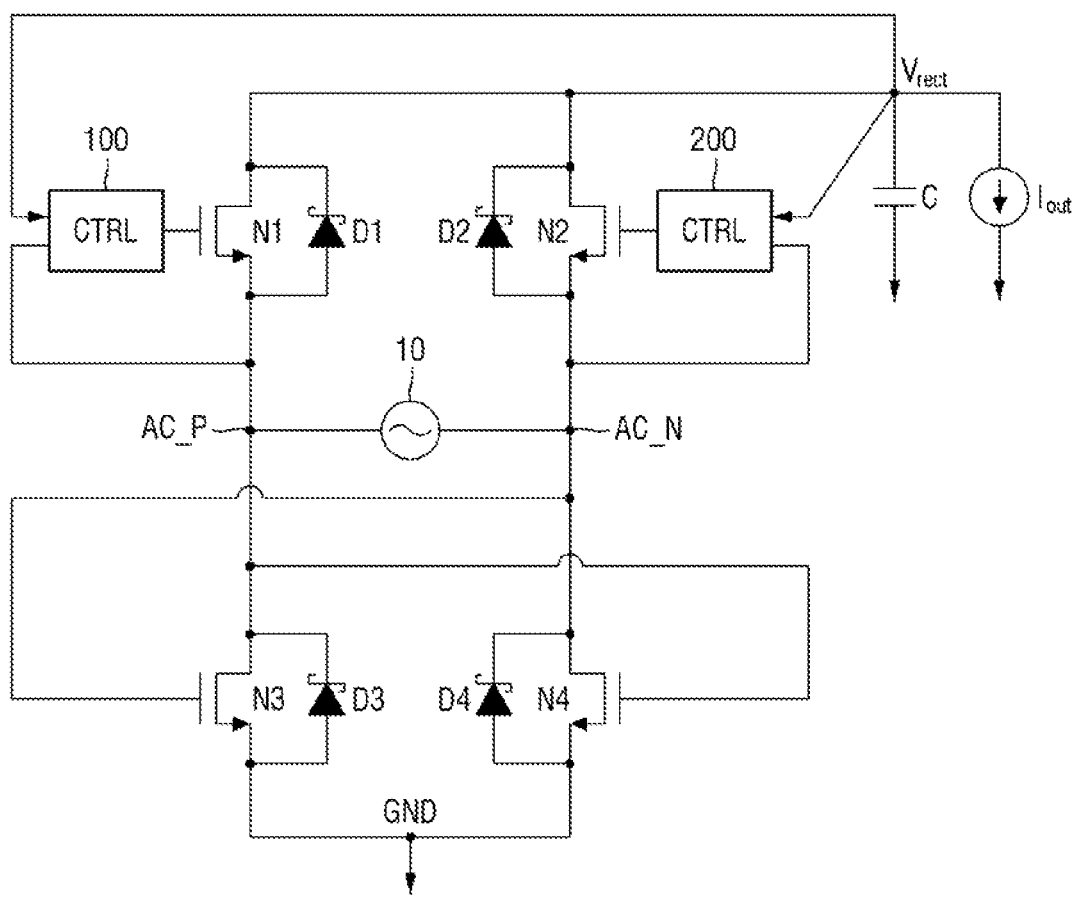
FIG. 1 is a block diagram of an example rectifier to which semiconductor devices according to embodiments can be applied.

FIG. 1 is a block diagram of an example rectifier 1 to which semiconductor devices according to embodiments can be applied. Rectifier 1 may be implemented as a hybrid active rectifier using a metal oxide semiconductor field effect transistor (MOSFET) as a switching element. Other rectifier types and configurations are also contemplated.

The example rectifier 1 may include four transistors N1 through N4. Transistors N1 and N2 are connected in parallel to each other and are turned on and off at different times. Transistors N3 and N4 are connected in parallel to each other and are connected in series with transistors N1 and N2, respectively. The transistors N3 and N4 are likewise turned on and off at different times.

In the current example, the transistors N1 through N4 are implemented as n-channel metal oxide semiconductor (NMOS) transistors. An alternating current (AC) voltage supplied from an AC power supply 10 is applied across nodes AC_P and AC_N. The resulting voltage at node AC_P, referenced to ground (GND), is referred to hereafter as $V_{AC\_P}$ while the voltage at node AC_N, referenced to GND, will be denoted $V_{AC\_N}$. A source of the transistor N1 and a drain of the transistor N3 may each be connected to the node AC_P, and a source of the transistor N2 and a drain of the transistor N4 may be connected to the node AC_N.

The AC voltage is converted into a rectified voltage Vrect, which is a direct current (DC) voltage, by the turn-on and turn-off operations of the transistors N1 through N4.

Specifically, in a period during which $V_{AC\_P}$ minus $V_{AC\_N}$ is positive, the transistors N1 and N4 are turned on, and the transistors N2 and N3 are turned off. To this end, a semiconductor device 100 turns on the transistor N1 in a period approximately coinciding with $V_{AC\_P}$ minus $V_{AC\_N}$ being positive. This period also substantially coincides with $V_{AC\_P}$ (referenced to GND) being positive, since transistor N4 is ON and the drain to source voltage $V_{DS}$ across transistor N4 is close to zero, whereby nodes GND and AC_N are at nearly the same potential during this time period. (Current flow is from source to drain in this example.) This period may be referred to as a first half cycle of the AC voltage cycle. In addition, since the transistor N4 is implemented to be gated (self-driving connection) by the voltage $V_{AC\_P}$, it is turned on in the period during which $V_{AC\_P}$ is positive. The semiconductor device 100 precisely controls the operation of the transistor N1 particularly in a high-speed operating environment to enable the rectifier 1 to efficiently and stably convert AC voltage. This will be described in detail later with reference to FIGS. 2 through 13.

Transistors N2 and N3 are switched on and off in a complementary manner to transistors N1 and N4, respectively. Thus, in a period during which $V_{AC\_N}$ minus $V_{AC\_P}$ is positive, the transistors N1 and N4 are turned off, and the transistors N2 and N3 are turned on (and $V_{AC\_N}$ referenced to GND is thereby positive). To this end, a semiconductor device 200 turns on the transistor N2 during a period approximately coinciding with $V_{AC\_N}$ being positive. In addition, since the transistor N3 is implemented to be gated (self-driving connection) by $V_{AC\_N}$, it is turned on in the period during which $V_{AC\_N}$ (referenced to GND) is positive. As described below, semiconductor device 200 precisely controls the operation of the transistor N2 particularly in the high-speed operating environment to enable the rectifier 1 to efficiently and stably convert AC voltage.

In the current example, Schottky barrier diodes D1 through D4 having a small voltage drop and a high switching speed, may be connected in parallel (across the drain to source path) with transistors N1 through N4, respectively. Note, however, that the detailed configuration of the rectifier 1 may vary depending on the purpose of implementation.

It should be noted that the scope of the disclosure is not limited to a particular form of rectifier. Thus, rectifier 1 can also be implemented in various other ways.

Various implementations of the semiconductor devices 100 and 200 will hereinafter be described with reference to FIGS. 2 through 13. In implementing the rectifier 1, semiconductor devices 100 and 200 may have the same configurations and operate the same way but with complementary timing to achieve the desired on-off switching of the transistors N1 and N2. Alternatively, they may have different configurations, so long as the transistor switching objectives are realized.

In FIGS. 2 through 13, only the semiconductor device 100 which controls the operation of the transistor N1 is described in order to avoid redundancy. However, the same description is applicable to the semiconductor device 200 which controls the operation of the transistor N2.

Figure 2:
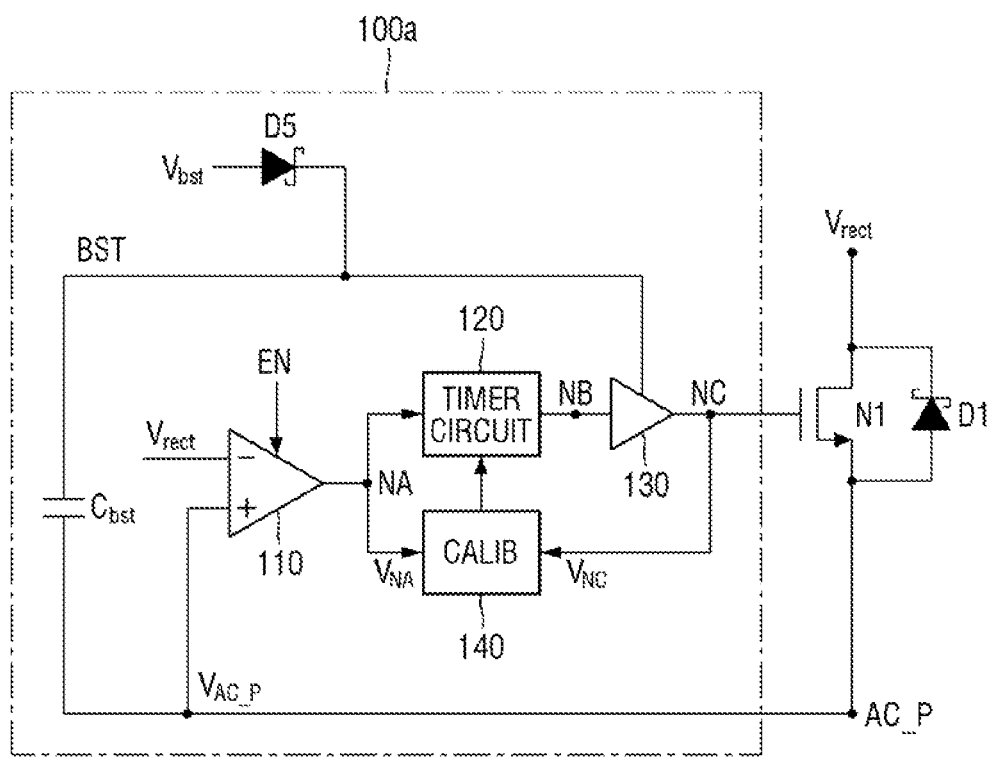
FIG. 2 is a circuit diagram of a semiconductor device according to an embodiment.

FIG. 2 is a circuit diagram of a semiconductor device 100a according to an embodiment. Semiconductor device 100a includes a first comparator 110, a timer circuit 120, a driver 130, and a calibration circuit 140. Device 100a is electrically connected to transistor N1 by a node NC corresponding to a gate of the transistor N1 and node AC_P corresponding to a source of the transistor N1.

The comparator 110 controls the voltage level $V_{NA}$ of a node NA by comparing $V_{AC\_P}$ with a rectified voltage Vrect.

For example, the comparator 110 may compare $V_{AC\_P}$ with Vrect and output logic low to the node NA in a period during which $V_{AC\_P}$ is lower than Vrect. In a period during which $V_{AC\_P}$ is equal to or higher than Vrect, the comparator 110 may output $V_{NA}$ as logic high. However, due to a delay required for circuit operation, $V_{NA}$ may transition later than when $V_{AC\_P}$ becomes equal to Vrect. (See e.g. delay d1 of FIG. 3.)

In some embodiments, the comparator 110 may comprise a full active rectifier (FAR) comparator. The comparator 110 may be controlled by an enable signal EN for determining whether to operate the comparator 110.

The timer circuit 120 operates a timer according to $V_{NA}$ and controls the voltage level $V_{NB}$ of a node NB.

For example, the timer circuit 120 operates the timer included therein when $V_{NA}$ becomes logic high. When the operation of the timer starts, transitions to logic high. When the operation of the timer ends, $V_{NB}$ transitions to logic low. (See e.g. the period A of FIG. 3, which is an example period of the timer operation.)

The timer circuit 120 controls the time during which $V_{NB}$ is maintained at logic high by using the timer. The timer circuit 120 is configured to dynamically set a time duration for the timer's operation. Accordingly, the timer circuit 120 can increase or decrease the time during which the $V_{NB}$ is maintained at logic high by adjusting the operation of the timer to meet the requirements for implementation purposes or operating environment.

The timer circuit 120 may receive a timer calibration signal for calibrating the operation time of the timer from the calibration circuit 140, which will be described later, and may change the maximum time value of the timer according to the time calibration signal.

The driver 130 drives the transistor N1 by controlling the voltage level $V_{NC}$ of the node NC according to $V_{NB}$.

For example, when $V_{NB}$ becomes logic high, the driver 130 may turn the voltage level $V_{NC}$ of the node NC corresponding to the gate of the transistor N1 to logic high, thereby turning on transistor N1. In addition, when $V_{NB}$ becomes logic low, the driver 130 may turn $V_{NC}$ to logic low, thereby turning off transistor N1. However, due to a delay required for circuit operation, $V_{NC}$ may transition later than when $V_{NB}$ transitions. (See e.g. delay d2 of FIG. 3.)

In some embodiments, the driver 130 may include a high-performance driver for a FAR. In this case, the driver 130 may be enabled under the control of a node BST to which a boost voltage Vbst is applied via a diode D5.

The calibration circuit 140 receives $V_{NA}$ and $V_{NC}$ and based on these voltages, generates the timer calibration signal for calibrating the operation time of the timer, and provides the timer calibration signal to the timer circuit 120.

The calibration circuit 140 "generates a judge time window" of a duration J when $V_{NC}$ transitions from logic high to logic low. (See e.g. judge time window W of FIG. 3, of a duration J.) That is, calibration circuit 140 starts an internal timer that counts for the period J, and a voltage is monitored during this period. Specifically, calibration circuit 140 monitors $V_{NA}$ during a time corresponding to the judge time window and generates a timer calibration signal based on the monitoring result.

For example when $V_{NA}$ transitions from logic high to logic low during the judge time window, the calibration circuit 140 may determine that the operation time of the transistor N1 is within a normal range. Accordingly, the calibration circuit 140 may not thereafter provide a timer calibration signal to the timer circuit 120.

In another example, when $V_{NA}$ is maintained at the logic high or logic low throughout the judge time window, the calibration circuit 140 may determine that the operation time of the transistor N1 is outside the normal range.

When $V_{NA}$ is maintained at logic high throughout the judge time window, the calibration circuit 140 may thereafter provide a timer calibration signal to timer circuit 120 for extending the operation time of its timer. Accordingly, the operation time of the transistor N1 may be extended in a next cycle.

On the other hand, when $V_{NA}$ is maintained at logic low throughout the judge time window, the calibration circuit 140 may thereafter provide a timer calibration signal to timer circuit 120 for shortening the operation time of its timer. Accordingly, the operation time of the transistor N1 may be shortened in the next cycle.

The timer circuit 120 may receive the timer calibration signal for extending or shortening the operation time of the timer from the calibration circuit 140 and change the maximum time value of the timer according to the timer calibration signal.

Figure 3:
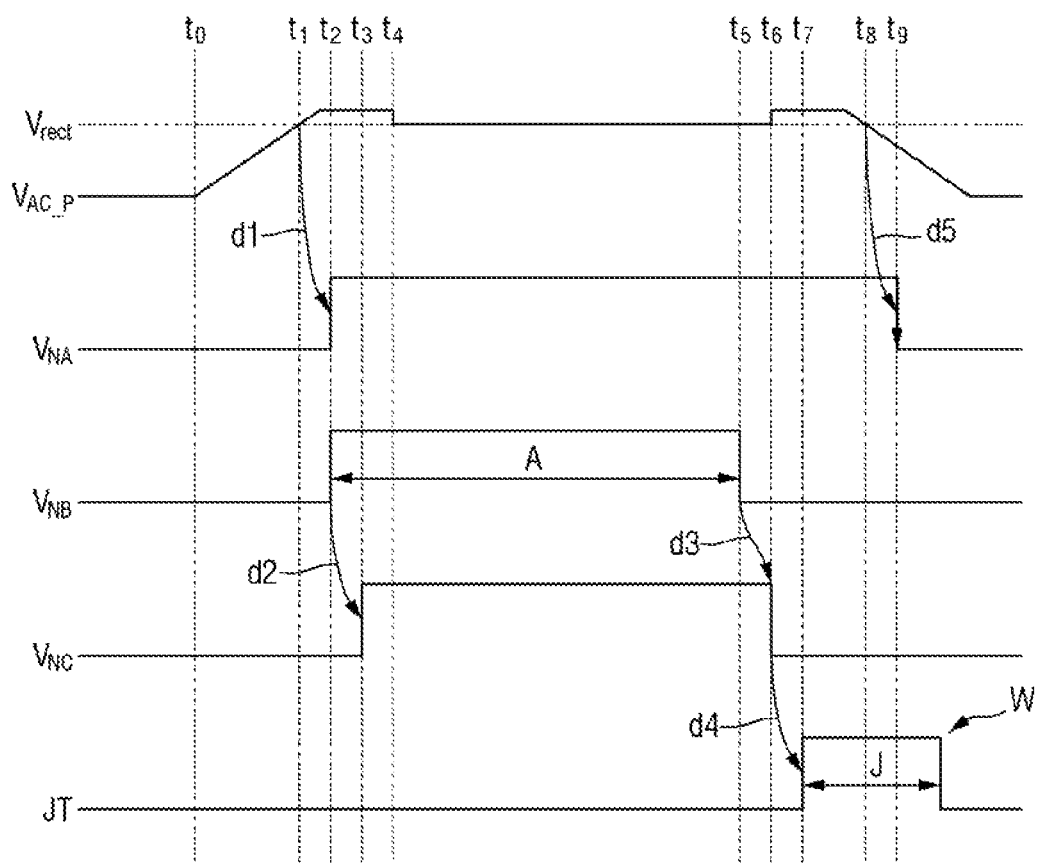
FIGS. 3, 4 and 5 are each a timing diagram illustrating a respective operation example of the semiconductor device according to the embodiment of FIG. 2.
Figure 4:
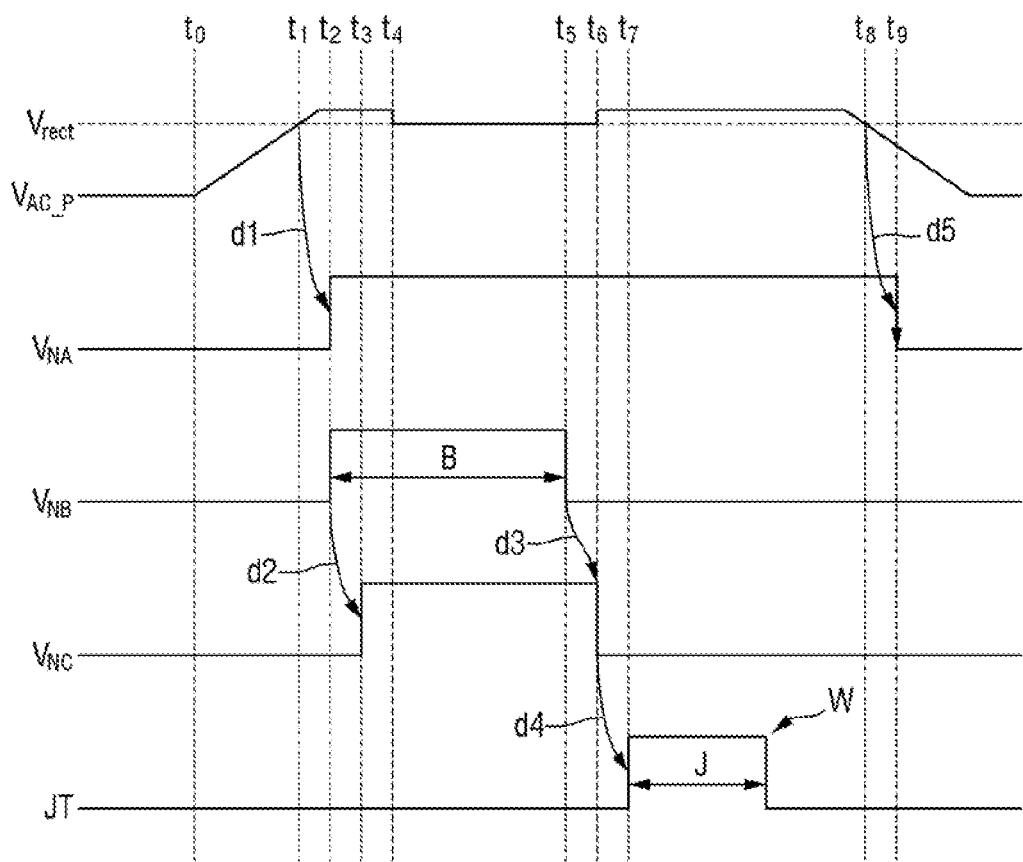
Figure 5:
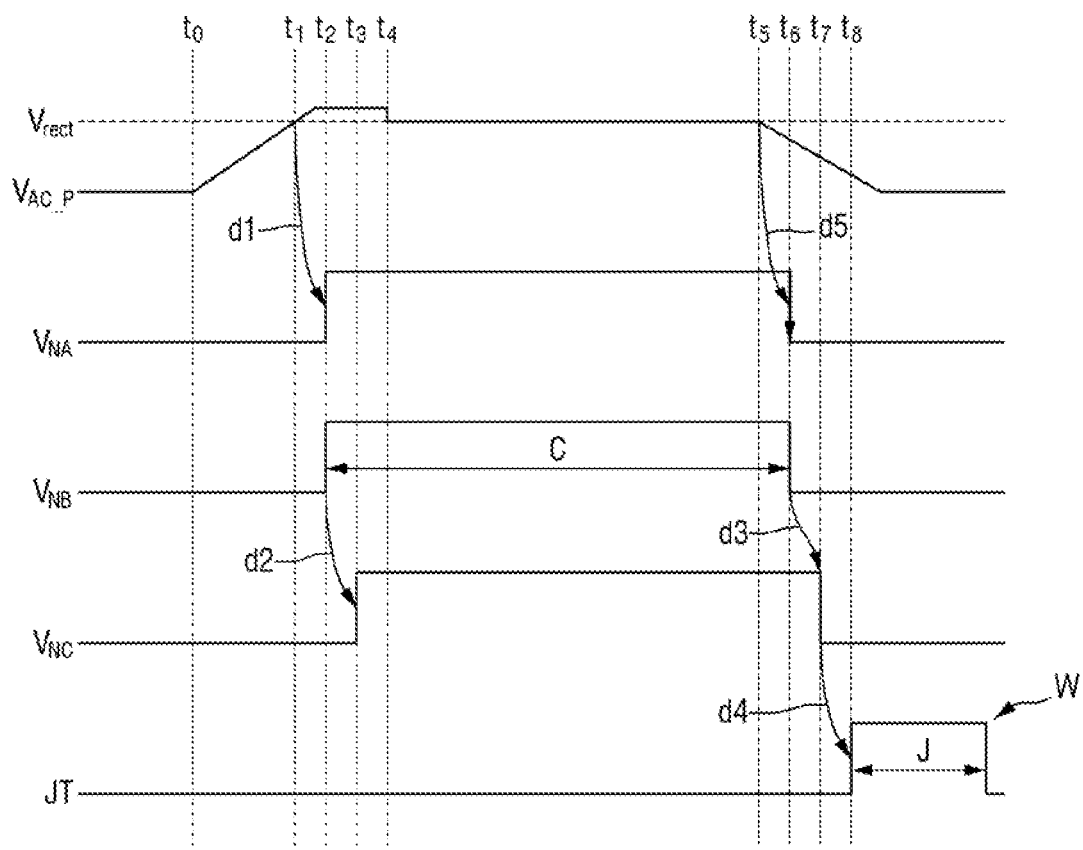

FIGS. 3 through 5 are timing diagrams illustrating operation examples of the semiconductor device 100a according to the embodiment of FIG. 2.

Specifically, FIG. 3 illustrates a case where the operation time of the transistor N1 is within the normal range, FIG. 4 illustrates a case where the operation time of the transistor N1 is not within the normal range and needs to be extended, and FIG. 5 illustrates a case where the operation time of the transistor N1 is not within the normal range and needs to be shortened.

Referring to FIG. 3, when AC is applied from the AC power supply 10 of FIG. 1, $V_{AC\_P}$ starts to rise at a time $t_0$.

The comparator 110, which compares $V_{AC\_P}$ with Vrect, outputs logic low to the node NA ($V_{NA}$ is logic low) at time $t_0$. Then, when $V_{AC\_P}$ reaches Vrect at a time the comparator 110 transitions $V_{NA}$ to logic high.

$V_{NA}$ transitions to logic high at a time $t_2$ after a delay d1. At the time $t_2$, the timer circuit 120 operates the timer according to $V_{NA}$ and transitions $V_{NB}$ to logic high. The timer started at the time $t_2$ continues to operate for a time period. A until a time $t_5$. Meanwhile, at time $t_2$, $V_{AC\_P}$ has risen to a level slightly above Vrect.

At a time $t_3$ after a delay d2, the voltage level $V_{NC}$ of the node NC transitions to logic high. Accordingly, the transistor N1 is turned on at time t4 after a short delay, and $V_{AC\_P}$ drops to become approximately equal to Vrect by virtue of the near zero voltage differential across the source to drain terminals of transistor N1. Thus, returning momentarily to FIG. 1, during approximately a one half AC cycle ("first half of AC cycle") following time t4 in which transistor N1 is turned on, current flow is as follows, assuming a start point at node AC_P: from node AC_P through the source-drain of transistor N1 to the node at which Vrect is present (Vrect node); from the Vrect node through a load (not shown) connected between the Vrect node and GND; from GND through the source-drain of transistor N4 (which is also turned on in this period) to node AC_N; and from node AC_N back to AC_P. Following this approximate one half AC cycle, a "second half of AC, cycle" begins in which transistors N2 and N3 are shortly turned on in a similar manner through similar control by control circuit 200, while transistors N1 and N4 are turned off. Here, current likewise flows from the Vrect node through the load to GND, i.e., in the same direction as in the first half of the cycle. Accordingly, current flows in the same direction throughout both halves of the AC cycle, whereby the AC voltage applied by AC power supply 10 is rectified and converted to a DC voltage. If, however, an undesirable reverse current flows, when the transistor on-off timing is uncalibrated (and misaligned with the AC cycle), such a reverse current flows in the opposite direction, e.g. from the Vrect node through the drain to source path of transistor N1 to node AC_P.

Referring still to FIG. 3, the timer preset by the timer circuit 120 ends at a time $t_5$.

Thus, $V_{NC}$ transitions to logic low at a time $t_6$ after a delay d3. Accordingly, the transistor N1 is turned off, so that current flow is shortly thereafter switched to the path of the second half AC cycle (through transistors N2 and N3) as described above.

After $V_{NC}$ transitions to logic low at the time $t_6$, the calibration circuit 140 generates a judge, time window W (by means of a signal JT). Specifically, the calibration circuit 140 generates the judge time window W of a specific time duration J from a time $t_7$ after a delay d4 from the time $t_6$. Then, the calibration circuit 140 monitors $V_{NA}$ during the time of the judge time window W.

In the current example, $V_{NA}$ transitions from logic high to logic low at a time $t_9$ included in the judge time window W. Specifically, when $V_{AC\_P}$ falls to reach Vrect at a time $t_8$, $V_{NA}$ transitions to logic low at the time $t_9$ after a delay d5.

In this case, the calibration circuit 140 may determine that the operation time of the transistor N1 is within the normal range. Accordingly, the calibration circuit 140 does not provide the timer calibration signal to the timer circuit 120, and the operation time A of the timer of the timer circuit 120 is maintained unchanged even in the next cycle for converting the first AC voltage into the rectified voltage Vrect.

Referring to FIG. 4, when the first AC voltage is applied from the AC power supply 10 of FIG. 1, $V_{AC\_P}$ starts to rise at a time $t_0$.

The comparator 110 which compares $V_{AC\_P}$ with Vrect outputs $V_{NA}$ at logic low. Then, when $V_{AC\_P}$ reaches Vrect at a time $t_1$, the comparator 110 transitions $V_{NA}$ to logic high.

$V_{NA}$ transitions to logic high a time $t_2$ after a delay d1. At the time $t_2$, the timer circuit 120 operates the timer according to $V_{NA}$ and transitions $V_{NB}$ to logic high. The timer started at the time t7, continues to operate for a time period B until a time $t_5$.

At a time $t_3$ after a delay d2, the voltage level of the node NC transitions to logic high. Accordingly, the transistor N1 is turned on, and current flow during the first half of the AC cycle is as described above from a time $t_4$.

The timer preset by the timer circuit 120 ends at the time $t_5$.

Thus, $V_{NC}$ transitions to logic low at a time $t_6$ after a delay d3. Accordingly, the transistor N1 is turned off, and the current flow is no longer through transistor N1.

After $V_{NC}$ transitions to logic low at the time $t_6$, the calibration circuit 140 generates a judge time signal JT with window W. Specifically, the calibration circuit 140 generates the judge time window W of a specific time duration J from a time $t_7$ after a delay d4 from the time $t_6$. Then, the calibration circuit 140 monitors $V_{NA}$ during the period J of the judge time window W.

In the current example of FIG. 4, $V_{NA}$ transitions from logic high to logic low at a time $t_9$ outside the judge time window W. Specifically, when $V_{AC\_P}$ falls to reach Vrect at a time $t_8$. $V_{NA}$ transitions to logic low at the time $t_9$ after a delay d5.

Therefore, $V_{NA}$ is maintained at logic high throughout the period J of the judge time window W. In this case, the calibration circuit 140 may determine that the operation time of the transistor N1 is not within the normal range. In particular, in this case, although average overall current flow is still in the direction from the Vrect node through the output load to GND over the entire AC cycle, overall efficiency of the rectifier circuit 1 is reduced due to the short operation time of the timer. That is, there is a reverse current during a small portion of the overall AC cycle, which reduces efficiency.

To prevent such inefficiency, the calibration circuit 140 provides the timer calibration signal for extending the operation time of the timer to the timer circuit 120. The timer circuit 120 which receives the timer calibration signal extends the operation time of the timer in the next cycle for converting the AC voltage into the rectified voltage Vrect. This can reduce the inefficiency of not fully converting the AC voltage over both halves of the AC cycle due to the short operation time of the timer in the previous cycle.

Referring to FIG. 5, when $V_{AC\_P}$ is generated from the application of AC power supply 10 of FIG. 1, $V_{AC\_P}$ starts to rise at a time $t_0$.

The comparator 110 which compares $V_{AC\_P}$ with Vrect outputs $V_{NA}$ as logic low. Then, when $V_{AC\_P}$ reaches Vrect at a time $t_1$, the comparator 110 transitions $V_{NA}$ to logic high.

$V_{NA}$ transitions to logic high at a time $t_2$ after a delay d1. At the time $t_2$, the timer circuit 120 operates the timer according to $V_{NA}$ and transitions $V_{NB}$ to logic high. The timer started at the time continues to operate for a time period C until a time $t_5$.

At a time $t_3$ after a delay d2, $V_{NC}$ transitions to logic high. Accordingly, the transistor N1 is turned on, and current flows in the direction from the node of Vrect through an output load to GND from a time $t_4$.

$V_{NA}$ transitions from logic high to logic low at a time $t_6$ outside a judge time window W. Specifically, when $V_{AC\_P}$ falls to reach Vrect at the time $t_5$, $V_{NA}$ transitions to logic low at the time $t_6$ after a delay d5.

The timer preset by the timer circuit 120 ends at the time $t_6$.

Thus, $V_{NC}$ transitions to logic low at a time $t_7$ after a delay d3. Accordingly, the transistor N1 is turned off, and the process of conversion during the first half of the AC cycle ends.

After $V_{NC}$ transitions to logic low at the time $t_7$, the calibration circuit 140 generates the judge time window W. Specifically, the calibration circuit 140 generates the judge time window W of a specific time duration J from a time $t_8$ after a delay d4 from the time $t_7$. Then, the calibration circuit 140 monitors $V_{NA}$ during the period J of the judge time window W.

In the current example, $V_{NA}$ is maintained at logic low in a period corresponding to the judge time window W. In this case, the calibration circuit 140 may determine that the operation time of the transistor N1 is not within the normal range. In particular, in this case, although a period during which the first AC voltage can stably be converted into the rectified voltage Vrect has passed, the conversion of the first AC voltage continues until the time $t_1$ due to the long operation time of the timer. This can generate a reverse current and reduce efficiency.

To reduce such instability and inefficiency, the calibration circuit 140 provides the timer calibration signal for shortening the operation time of the timer to the timer circuit 120. The timer circuit 120 which receives the timer calibration signal shortens the operation time of the timer in the next cycle fin converting the first AC voltage into the rectified voltage Vrect. This can reduce the inability to convert the voltage $V_{AC\_P}$ stably and efficiently due to the long operation time of the timer in the previous cycle.

According to the various embodiments described above, the length of a period during which $V_{AC\_P}$ is converted into the rectified voltage Vrect is set precisely using the timer, and the operation time of the timer is adjusted by evaluating the stability and efficiency of voltage conversion in the previous cycle. Therefore, voltage conversion can be performed in an improved manner in the next cycle. Through operation of the timer, the percentage of time that the output current flows in the same direction, i.e., as direct current, is increased. Accordingly, voltage conversion can be performed efficiently and stably in the high-speed environment.

Figure 6:
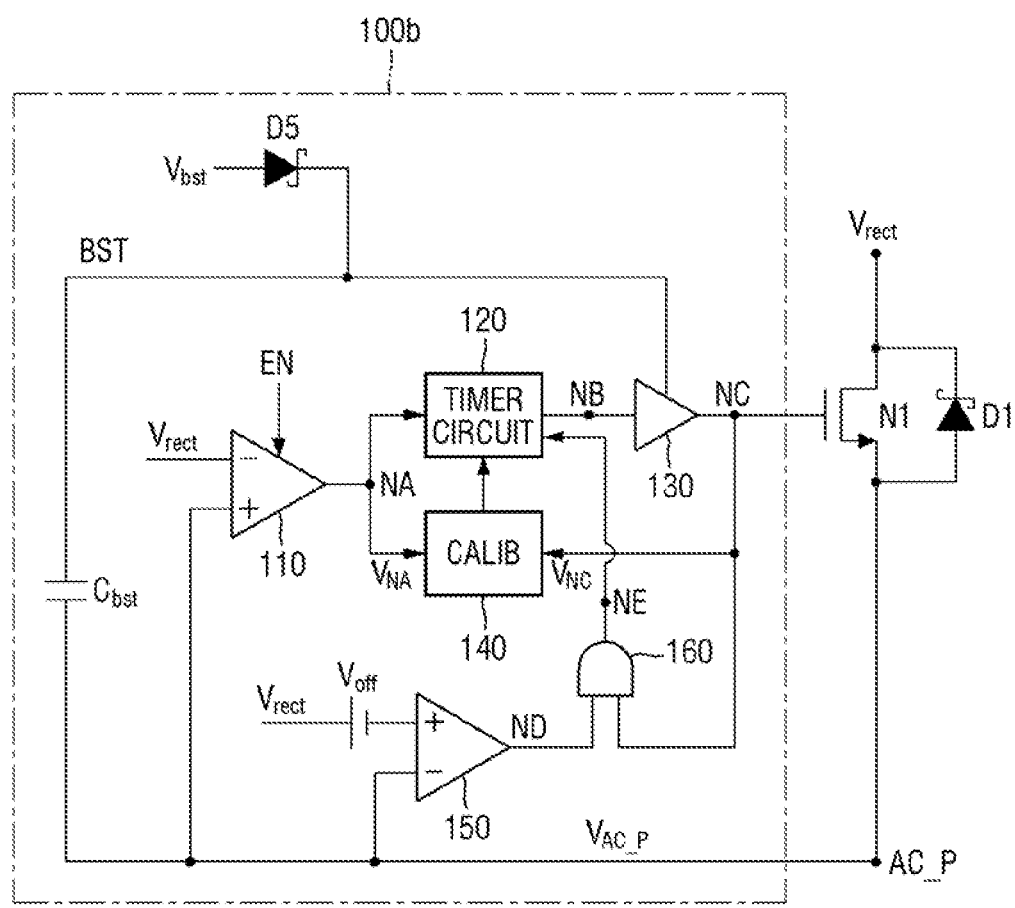
FIG. 6 is a circuit diagram of a semiconductor device according to an embodiment.

FIG. 6 is a circuit diagram of a semiconductor device 100b according to an embodiment.

Referring to FIG. 6, like the semiconductor device 100a according to the embodiment of FIG. 2, the semiconductor device 100b includes a first comparator 110, a timer circuit 120, a driver 130, and a calibration circuit 140. However, the semiconductor device 100b differs from the semiconductor device 100a of FIG. 2 in that it further includes a protection circuit (150 and 160).

The protection circuit (150 and 160) is designed to prevent a rectifier 1 from being damaged due to the continuation of voltage conversion even if a reverse current is generated from a node of rectified voltage Vrect through transistor N1 to the node AC_P.

Specifically, when the reverse current is generated from the rectified voltage Vrect to the node AC_P, the protection circuit (150 and 160) generates a timer stop signal for stopping the operation of a timer of the timer circuit 120 and provides the timer stop signal to the timer circuit 120. The timer circuit 120 stops the operation of the timer according to the timer stop signal, and the driver 130 turns off transistor N1 to stop the voltage conversion.

In the current embodiment, the protection circuit (150 and 160) includes a second comparator 150 and a logic gate 160.

The second comparator 150 determines whether the difference between Vrect and $V_{AC\_P}$ exceeds an offset voltage Voff and provides the determination result (voltage $V_{ND}$) at node ND. For example, when the offset voltage Voff is set to 200 mV, it is determined whether the difference between Vrect and the falling voltage level of the node AC_P exceeds 200 mV.

The logic gate 160 generates the timer stop signal by performing a logical operation on $V_{NC}$ and $V_{ND}$. It can be determined from $V_{NC}$ whether the transistor N1 is being operated, that is, whether the voltage conversion at that time is being performed. In addition, it can be determined from $V_{ND}$ whether the difference between Vrect and $V_{AC\_P}$ exceeds the offset voltage Voff. Therefore, the logic gate 160 may determine whether to generate the timer stop signal in consideration of $V_{NC}$ and $V_{ND}$.

In the current embodiment, the logic gate 160 is implemented as an AND logic gate, but can alternatively be implemented as any other logic gate depending on the specific configuration of the circuit.

Figure 7:
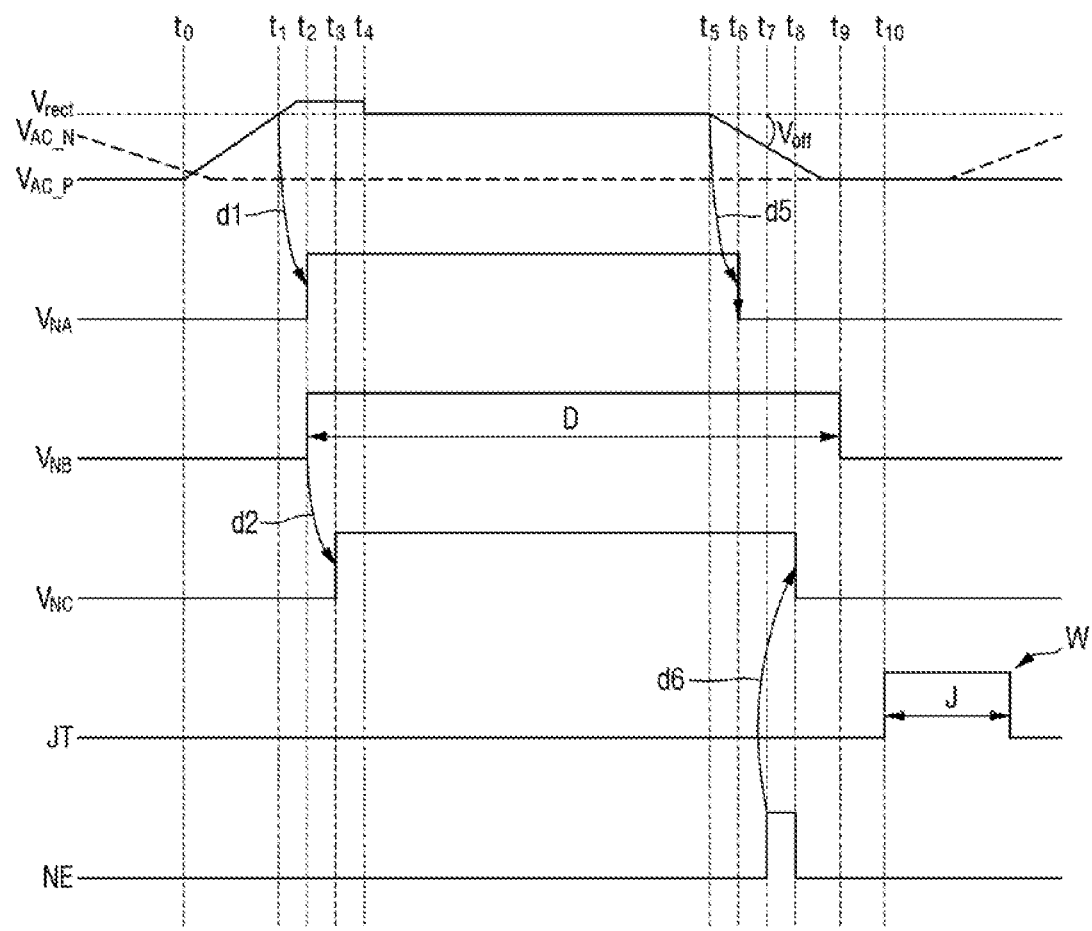
FIG. 7 is a timing diagram illustrating an operation example of the semiconductor device according to the embodiment of FIG. 6.

FIG. 7 is a timing diagram illustrating an operation example of the semiconductor device 100*b* according to the embodiment of FIG. 6.

Referring to FIG. 7, when the first AC voltage is applied from the AC power supply 10 of FIG. 1, $V_{AC\_P}$ starts to rise at a time $t_0$. On the other hand, the voltage level of a node AC_N to which the second AC voltage is applied falls as indicated by a dotted line.

The comparator 110 which compares $V_{AC\_P}$ with Vrect outputs logic low to a node NA. Then, when $V_{AC\_P}$ reaches Vrect at a time $t_1$, $V_{NA}$ transitions to logic high.

$V_{NA}$ transitions to logic high at a time $t_2$ after a delay d1. At the time $t_2$, the timer circuit 120 operates the timer according to $V_{NA}$ and transitions $V_{NB}$ to logic high. The timer started at the time $t_2$ continues to operate for a time period D until a time $t_5$.

At a time $t_3$ after a delay d2, the voltage level of the node NC transitions to logic high. Accordingly, the transistor N1 is turned on, and the first AC voltage is converted into the rectified voltage Vrect from a time $t_4$.

VNA transitions from logic high to logic low at a time $t_6$ outside a judge time window. Specifically, when $V_{AC\_P}$ falls to reach Vrect at the time $t_5$, $V_{NA}$ transitions to logic low at the time $t_6$ after a delay d5.

Even though $V_{AC\_P}$ is falling, the timer preset by the timer circuit 120 ends at a time $t_9$. Accordingly, there is a risk that a reverse current will be generated in a period from the time $t_7$ to the time $t_9$.

To prevent the generation of the reverse current, the protection circuit (150 and 160) generates a timer stop signal for stopping the operation of the timer of the timer circuit 120 at a node NE. Specifically, the protection circuit (150 and 160) generates the timer stop signal at the time $t_7$ when the transistor N1 is operating and when the difference between Vrect and $V_{AC\_P}$ exceeds the offset voltage Voff.

The timer circuit 120 stops the operation of the timer in response to the timer stop signal received via the node NE, and the driver 130 interrupts the voltage conversion by turning off the transistor N1 after a delay d6 from the time $t_7$.

Accordingly, the semiconductor device 100*b* can perform voltage conversion efficiently and stably in a high-speed environment and prevent the rectifier 1 from being damaged due to the continuation of the voltage conversion even if a reverse current is generated from the rectified voltage Vrect to the node AC_P.

Figure 8:
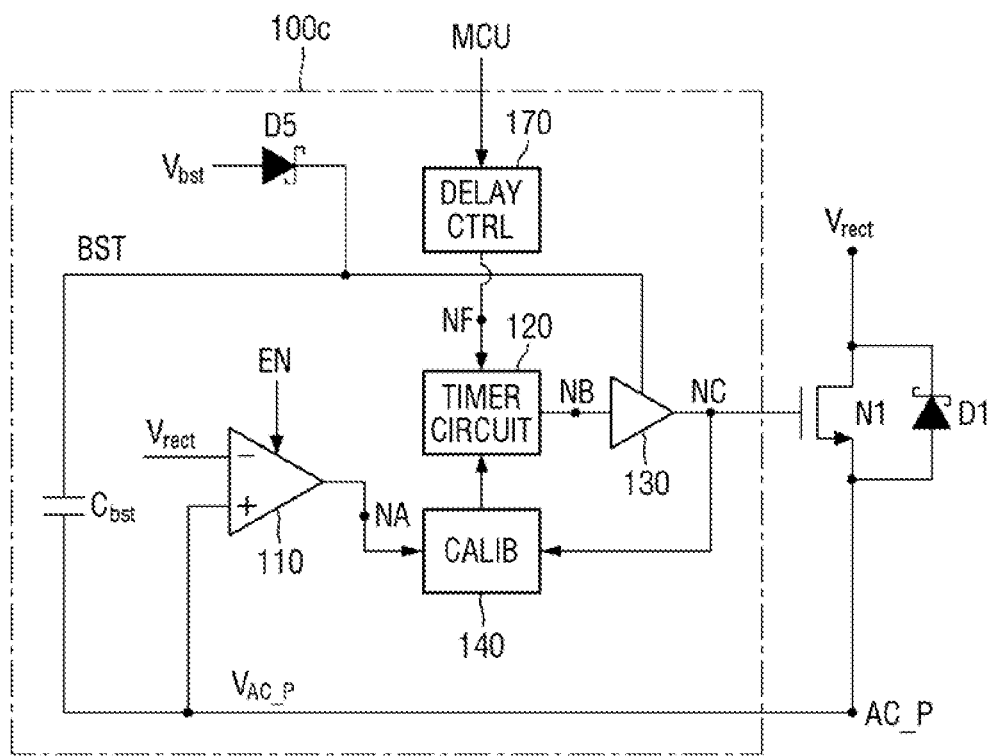
FIG. 8 is a circuit diagram of a semiconductor device according to an embodiment.

FIG. 8 is a circuit diagram of a semiconductor device 100*c* according to an embodiment.

Referring to FIG. 8, like the semiconductor device 100*a* according to the embodiment of FIG. 2, the semiconductor device 100*c* according to the current embodiment includes a first comparator 110, a timer circuit 120, a driver 130, and a calibration circuit 140. Semiconductor device 100*c* differs from the semiconductor device 100*a* in that it further includes a delay control circuit 170.

The delay control circuit 170 receives externally calculated delay time information, generates a delay signal for controlling the start time of the timer operation of the timer circuit 120 based on the delay time information, and provides the delay signal to the timer circuit 120.

In some embodiments, the delay control circuit 170 may receive the delay time information from a microcontroller.

The timer circuit 120 receives the delay signal from the delay control circuit 170 via a node NF and sets the start time of the timer operation based on the delay signal.

Accordingly, the semiconductor device 100*c* can be more precisely controlled to maximize the voltage conversion efficiency in cooperation with an external device (e.g., a microcontroller) while performing voltage conversion efficiently and stably in a high-speed environment.

Figure 9:
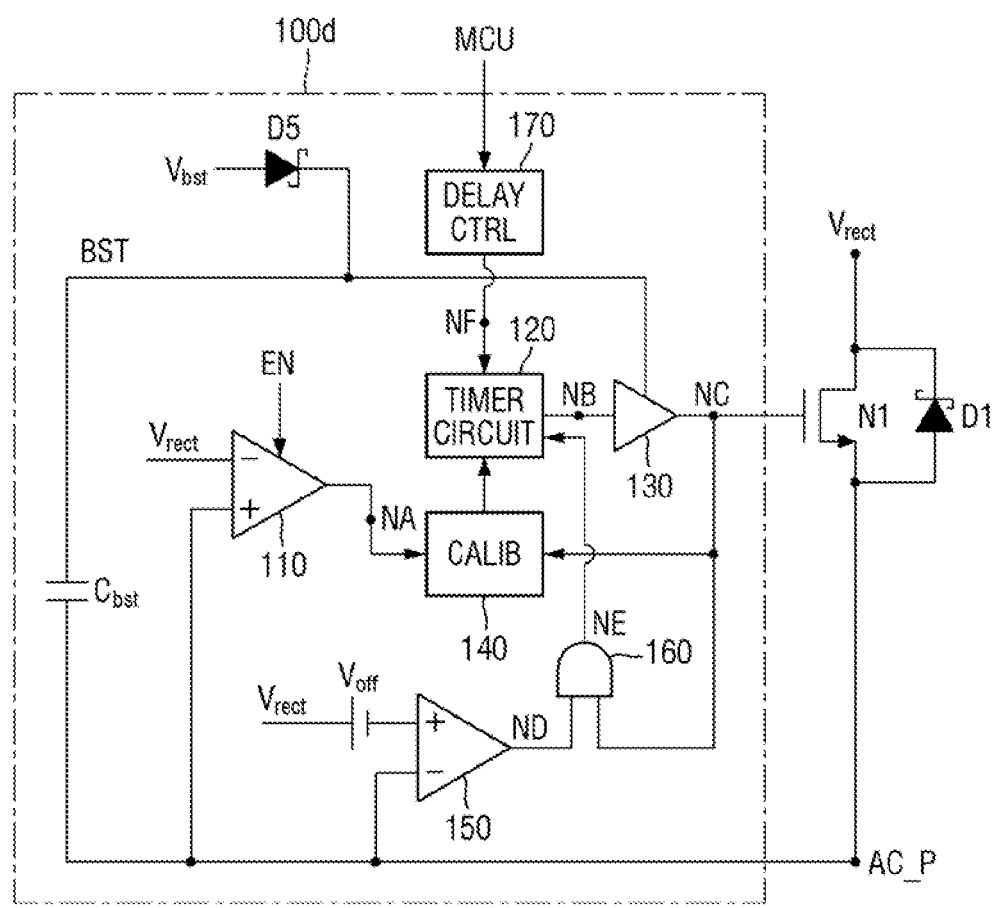
FIG. 9 is a circuit diagram of a semiconductor device according to an embodiment.

FIG. 9 is a circuit diagram of a semiconductor device 100*d* according to an embodiment. Similar to semiconductor device 100*c* of FIG. 8, the semiconductor device 100*d* according to the current embodiment includes a first comparator 110, a timer circuit 120, a driver 130, a calibration circuit 140 and a delay control circuit 170. Semiconductor device 100*d* differs from device 100*c* by further including a protection circuit (150 and 160) described above with reference to FIG. 6.

Accordingly, the semiconductor device 100*d* can perform voltage conversion efficiently and stably in a high-speed environment and prevent a rectifier 1 from being damaged due to the continuation of the voltage conversion even if a reverse current is generated from a rectified voltage Vrect to a node AC_P. In addition, the semiconductor device 100*d* can be more precisely controlled to maximize the voltage conversion efficiency in cooperation with an external device (e.g., a microcontroller).

Figure 10:
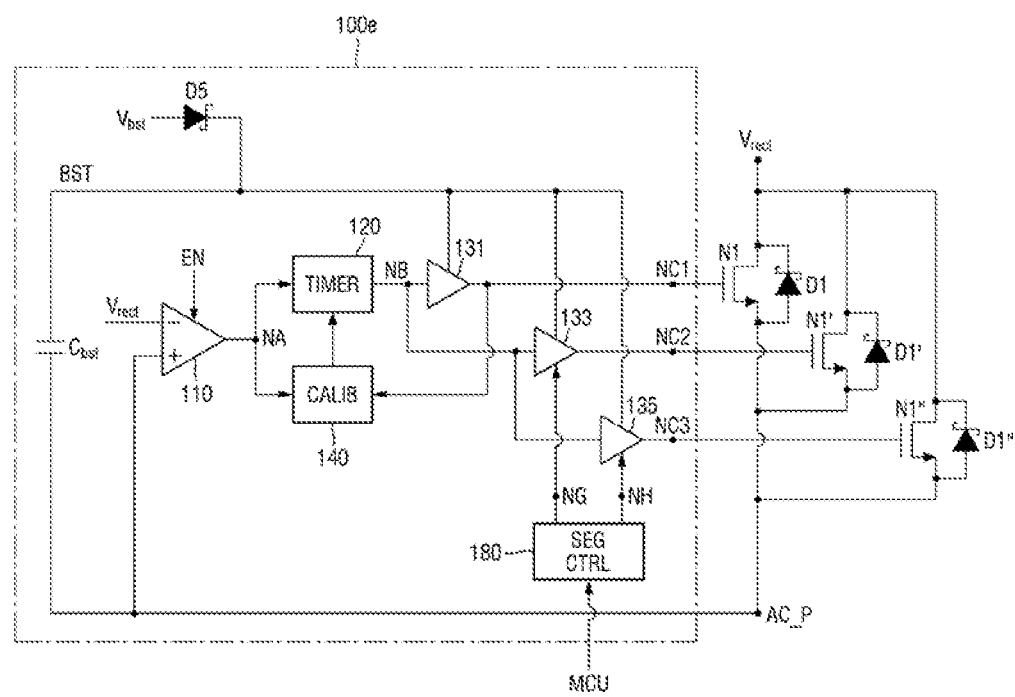
FIG. 10 is a circuit diagram of a semiconductor device according to an embodiment.

FIG. 10 is a circuit diagram of a semiconductor device 100*e* according to an embodiment. Semiconductor device 100*e* includes a first comparator 110, a timer circuit 120, and a calibration circuit 140, but differs from device 100*a* of FIG. 2 by including a plurality of drivers 131, 133, and 135 instead of the driver 130 and further includes a segment control circuit 180.

In this embodiment, a rectifier 1 includes additional transistors N1' and N1" connected in parallel to transistor N1. The transistors N1, N1' and N" may be used to change the total size of a transistor according to the specific load state of the rectifier 1. The drivers 131, 133, and 135 drive the transistors N1, N1', and N1", respectively.

The segment control circuit 180 receives a transistor segment control signal from the exterior and controls the operation of the transistors N1' and N1" connected in parallel with the transistor N1. That is, the segment control circuit 180 adjusts the total size of a transistor by turning on or off the transistors N1' and N1" according to the operating, state or environment of the rectifier 1.

In some embodiments, the segment control circuit 180 may receive the transistor segment control signal from a microcontroller.

The drivers 133 and 135 may receive signals for controlling the transistors N1' and N1" from the segment control circuit 180 via nodes NG and NH and turn on or off the transistors N1' and N1" in response to the received signals.

Accordingly, the semiconductor device 100*e* can be more precisely controlled to maximize the voltage conversion efficiency by changing the size of a transistor according to the specific load state of the rectifier 1 in operation with an external device (e.g., a microcontroller) while performing voltage conversion efficiently and stably in a high-speed environment.

Figure 11:
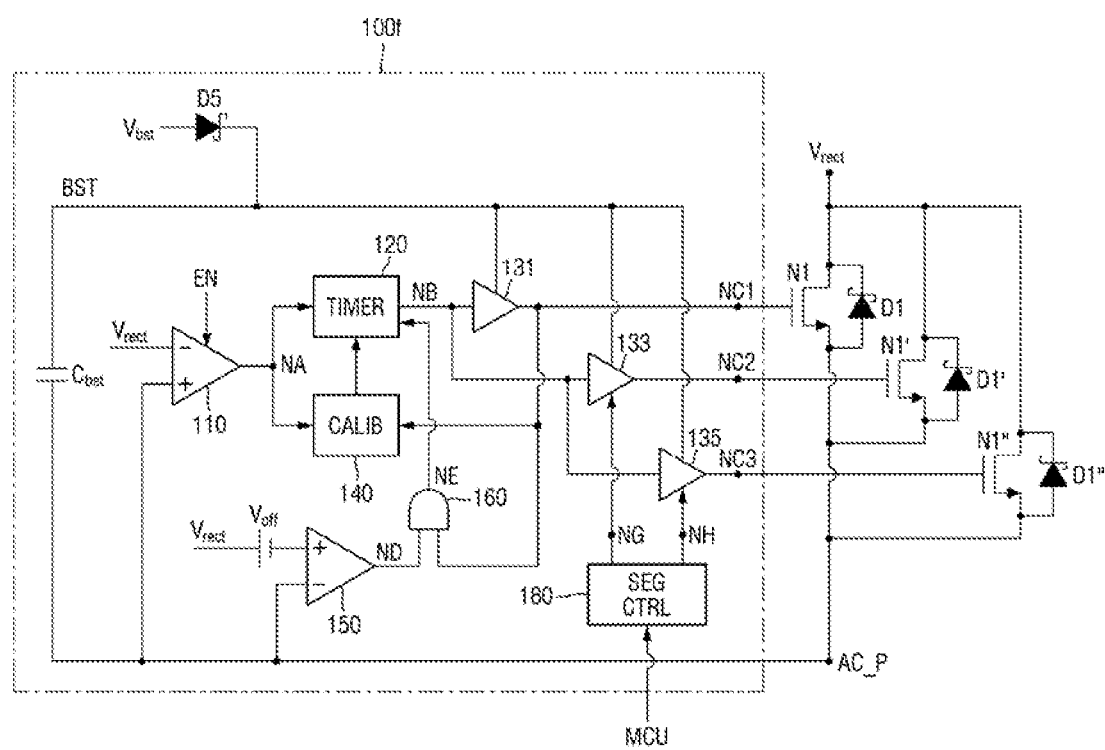
FIG. 11 is a circuit diagram of a semiconductor device according to an embodiment.

FIG. 11 is a circuit diagram of a semiconductor device 100*f* according to an embodiment. Semiconductor device 100*f* includes a first comparator 110, a timer circuit 120, a plurality of drivers 131, 133 and 135, a calibration circuit 140, and a segment control circuit 180. Semiconductor device 100f differs from device 100e of FIG. 10 in that it further includes a protection circuit (150 and 160) described above with reference to FIG. 6.

Accordingly, the semiconductor device 100f can perform voltage conversion efficiently and stably in a high-speed environment and prevent a rectifier 1 from being damaged due to the continuation of the voltage conversion even if a reverse current is generated from a rectified voltage Vrect to a node AC_P. In addition, the semiconductor device 100f can be more precisely controlled to maximize the voltage conversion efficiency by changing the size of a transistor according to the specific load state of the rectifier 1 in cooperation with an external device (e.g., a microcontroller).

Figure 12:
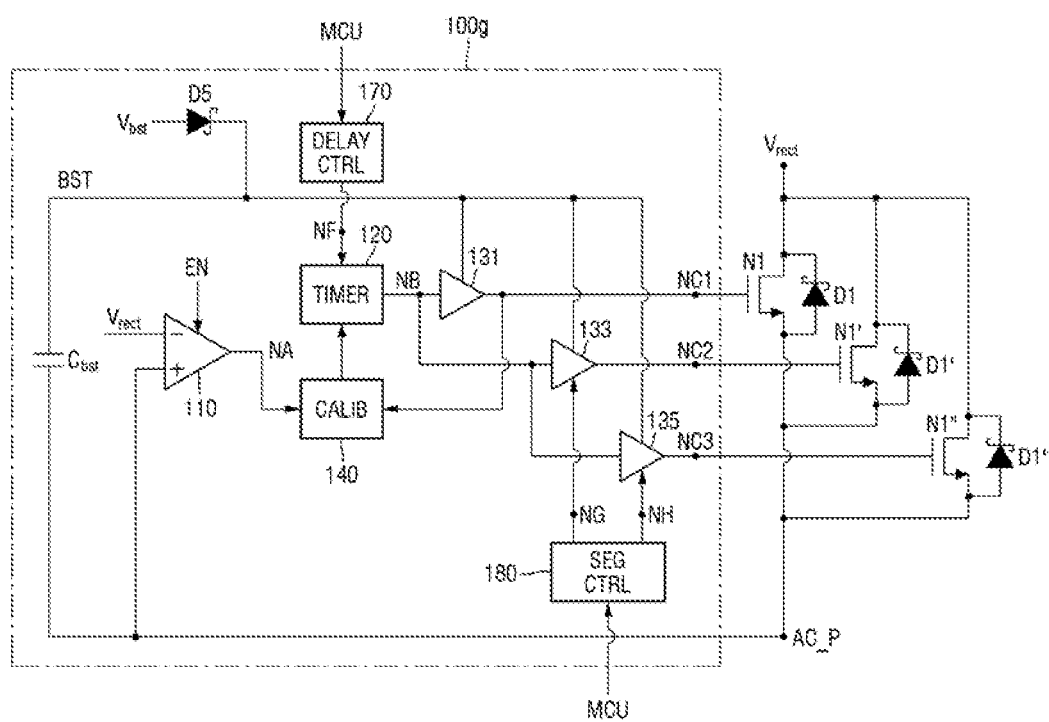
FIG. 12 is a circuit diagram of a semiconductor device according to an embodiment.

FIG. 12 is a circuit diagram of a semiconductor device 100g according to an embodiment. Semiconductor device 100g includes a first comparator 110, a timer circuit 120, a plurality of drivers 131, 133 and 135, a calibration circuit 140, a delay control circuit 170, and a segment control circuit 180.

Accordingly, semiconductor device 100g differs from device 100e of FIG. 10 by including delay control circuit 170. As described earlier in connection with FIG. 8, the inclusion of a delay control circuit 170 allows semiconductor device 100g to be more precisely controlled to maximize the voltage conversion efficiency in cooperation with an external device (e.g., a microcontroller) while performing voltage conversion efficiently and stably in a high-speed environment.

Figure 13:
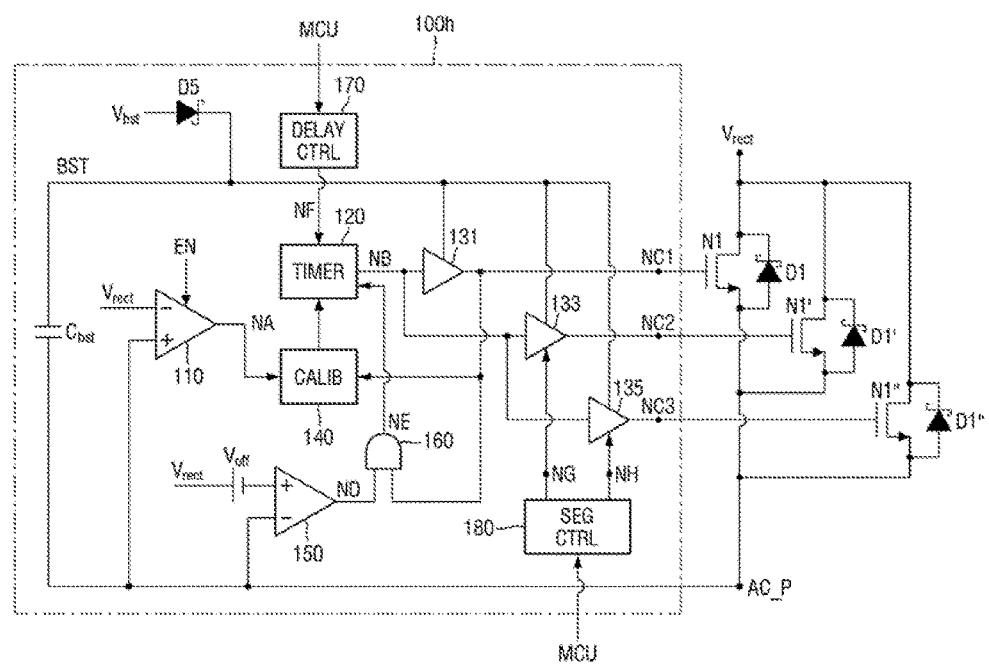
FIG. 13 is a circuit diagram of a semiconductor device according to an embodiment.

FIG. 13 is a circuit diagram of a semiconductor device 100h according to an embodiment.

Referring to FIG. 13, the semiconductor device 100h according to the embodiment includes a first comparator 110, a timer circuit 120, a plurality of drivers 131, 133 and 135, a calibration circuit 140, a protection circuit (150 and 160), a delay control circuit 170, and a segment control circuit 180.

Accordingly, by including all of the delay control circuit, the protection circuit and the segment control circuit, the semiconductor device 100g can perform voltage conversion efficiently and stably in a high-speed environment and prevent a rectifier 1 from being damaged due to the continuation of the voltage conversion even if a reverse current is generated from a rectified voltage Vrect to a node AC_P. In addition, the semiconductor device 100g can be more precisely controlled to maximize the voltage conversion efficiency in cooperation with an external device (e.g., a microcontroller).

A method of operating a semiconductor device according to various embodiments includes comparing the voltage level of a node AC_P with the voltage level of a rectified voltage Vrect and operating a timer of a timer circuit 120 that uses a node NA as an input by controlling $V_{NA}$ according to the comparison result.

The method includes driving a transistor N1 by controlling the voltage level of a node NC, which corresponds to an output of a driver 130, using the driver 130 which operates using a node NB corresponding to an output of the timer circuit 120 as an input.

The method also includes providing a timer calibration signal for calibrating the operation time of the timer to the timer circuit 120 by monitoring the voltage level of the node NA and the voltage level of the node NC.

In some embodiments, the operating of the timer of the timer circuit 120 may include operating the timer of the timer circuit 120 by controlling the voltage level of the node NA when the voltage level of the node rises to the voltage level of the rectified voltage Vrect.

In some embodiments, the providing of the timer calibration signal to the timer circuit 120 may include generating a judge time window in response to a change in the voltage level of the node NC, monitoring the voltage level of the node NA corresponding to the judge time window, and generating the timer calibration signal based on the monitoring result.

The method may further include generating a timer stop signal for stopping the operation of the timer and providing the timer stop signal to the timer circuit 120 when a reverse current is generated from the rectified voltage Vrect to the node AC_P.

In addition, the method may further include receiving externally calculated delay time information, generating a delay signal for controlling the start time of the timer operation of the timer circuit 120 based on the delay time information, and providing the delay signal to the timer circuit 120.

In addition, the method may further include receiving a transistor segment control signal from the outside and controlling the operation of the transistor N1 and transistors N1' and N1" connected in parallel to the transistor N1.

It is noted here that the above-described comparators and drivers are each configured by circuitry. As such, any of the comparators may alternatively be called a comparator circuit, and any of the drivers can alternatively be called a driver circuit.

Although example embodiments of the present disclosure have been disclosed for illustrative purposes, those skilled in the art will appreciate that various modifications, additions and substitutions are possible, without departing from the scope and spirit of the disclosure as set forth in the accompanying claims.

What is claimed is:

1. A semiconductor device comprising:
   a comparator which compares a first voltage with a rectified voltage and provides a second voltage in accordance with the comparison;
   a timer circuit which operates a timer according to the second voltage and outputs a third voltage in correspondence with an operation time of the timer;
   a driver which drives a transistor with a fourth voltage generated by the driver according to the third voltage; and
   a calibration circuit which generates a timer calibration signal based on the second voltage and the fourth voltage, the timer calibration signal being provided to the timer circuit and used to calibrate the operation time of the timer,
   wherein the calibration circuit monitors the second voltage voltage for calibration during a judge time window following a change in the fourth voltage, the judge time window being based on an internal timer when the second voltage transitions from a first level to a second level in a period of the judge time window, the calibration circuit refrains from providing the timer calibration signal to the timer circuit;
   when the second voltage is maintained at the first level in the period of the judge time window, the calibration circuit provides the timer calibration signal for extending the operation time of the timer to the timer circuit; and
   when the second voltage is maintained at the second level in the period of the judge time window, the calibration circuit provides the timer calibration signal for shortening the operation time of the timer to the timer circuit.

2. The semiconductor device of claim 1, wherein the first voltage is provided at a source of the transistor, and the fourth voltage is provided to a gate of the transistor.

3. A semiconductor device comprising:
- a comparator which compares a first voltage with a rectified voltage and provides a second voltage in accordance with the comparison;
- a timer circuit which operates a timer according to the second voltage and outputs a third voltage in correspondence with an operation time of the timer;
- a driver which drives a transistor with a fourth voltage generated by the driver according to the third voltage;
- a calibration circuit which generates a timer calibration signal based on the second voltage and the fourth voltage, the timer calibration signal being provided to the timer circuit and used to calibrate the operation time of the timer; and
- a protection circuit which generates a timer stop signal for stopping the operation of the timer and provides the timer stop signal to the timer circuit when a reverse current is generated from a node at which the rectified voltage is present to a node at which the first voltage is present.

4. The semiconductor device of claim 3, wherein the comparator is a first comparator and the protection circuit comprises:
- a second comparator which determines whether a difference between a level of the rectified voltage and the first voltage exceeds an offset voltage and provides a determination voltage in response to the determination; and
- a logic gate which generates the timer stop signal by performing a logical operation on the first voltage and the determination voltage.

5. The semiconductor device of claim 3, wherein the timer circuit stops the operation of the timer according to the timer stop signal, and the driver turns off the transistor.

6. A semiconductor device comprising:
- a comparator which compares a voltage level of a first node with a voltage level of a rectified voltage and controls a voltage level of a second node according to the comparison;
- a timer circuit which operates a timer according to the voltage level of the second node and controls a voltage level of a third node in correspondence with the timer operation;
- a driver which drives a transistor by controlling a voltage level of a fourth node according to the voltage level of the third node; and
- a protection circuit which monitors a current flowing between a node at which the rectified voltage is present and the first node and, when a reverse current is generated, generates a timer stop signal which is provided to the timer circuit for stopping the operation of the timer.

7. The semiconductor device of claim 6, wherein the comparator is a first comparator and the protection circuit comprises:
- a second comparator which determines whether a difference between a level of the rectified voltage and the voltage level of the first node exceeds an offset voltage and, in accordance with the determination, provides a determination voltage at a fifth node; and
- a logic gate which generates the timer stop signal by performing a logical operation on the determination voltage and the voltage level of the fourth node.

8. The semiconductor device of claim 6, wherein the timer circuit stops the operation of the timer according to the timer stop signal, and the driver turns off the transistor.

9. The semiconductor device of claim 6, wherein the first node is connected to a source of the transistor, and the fourth node is connected to a gate of the transistor.

10. The semiconductor device of claim 6, further comprising a calibration circuit which receives the voltage level of the second node and the voltage level of the fourth node, generates a timer calibration signal for calibrating an operation time of the timer, and provides the timer calibration signal to the timer circuit.

11. The semiconductor device of claim 10, wherein the calibration circuit generates a judge time window in response to a change in the voltage level of the fourth node.

12. The semiconductor device of claim 11, wherein the calibration circuit monitors the voltage level of the second node corresponding to the judge time window and generates the timer calibration signal based on a result of the monitoring.

13. A method of operating a semiconductor device, the method comprising:
- comparing a first voltage with a rectified voltage and outputting a second voltage according to the comparison;
- operating a timer of a timer circuit which uses the second voltage as an input, the timer circuit outputting a third voltage in correspondence with an operating time of the timer;
- driving a transistor with a fourth voltage provided by a driver that receives the third voltage;
- providing a timer calibration signal to the timer circuit for calibrating the operation time of the timer, based on the second voltage and the fourth voltage monitoring the second voltage for calibration during a judge time window following a change in the fourth voltage, the judge time window being based on an internal timer;
- refraining from providing the timer calibration signal to the timer circuit when the second voltage transitions from a first level to a second level in a period of the judge time window;
- when the second voltage is maintained at the first level in the period of the judge time window, providing the timer calibration signal for extending the operation time of the timer to the timer circuit; and
- when the second voltage is maintained at the second level in the period of the judge time window, providing the timer calibration signal for shortening the operation time of the timer to the timer circuit.

14. The method of claim 13, wherein the operating of the timer of the timer circuit comprises operating the timer of the timer circuit by controlling the second voltage when the first voltage rises to a level of the rectified voltage.

15. The method of claim 13, further comprising generating a timer stop signal for stopping the operation of the timer and providing the timer stop signal to the timer circuit when a reverse current is generated from the rectified voltage to the first node.

16. The method of claim 15, wherein the generating of the timer stop signal and the providing of the timer stop signal comprises:
- determining whether a difference between the rectified voltage and the first voltage exceeds an offset voltage, and generating a determination voltage in accordance with the determination; and generating the timer stop signal by performing a logical operation on the fourth voltage and the determination voltage.

17. The semiconductor device of claim 1, wherein:
the semiconductor device is a rectifier, the transistor is a first transistor of the rectifier, the rectifier further including second, third and fourth transistors, the first and second transistors forming part of an upper half of the rectifier, the third and fourth transistors forming part of a lower part of the rectifier; and
the rectifier further including a second comparator, a second timer circuit, a second driver circuit and a second calibration circuit which are together configured as a controller to control operation of the second transistor,
wherein the third transistor has a gate connected directly to a source of the second transistor, and the fourth transistor has a gate connected directly to a source of the first transistor.

* * * * *